United States Patent

Morita

[19]

[11] Patent Number: 5,926,003
[45] Date of Patent: Jul. 20, 1999

[54] BATTERY CHARGER

[75] Inventor: Hideyo Morita, Sumoto, Japan

[73] Assignee: Sanyo Electric Co., Ltd., Osaka, Japan

[21] Appl. No.: 08/791,815

[22] Filed: Jan. 30, 1997

[30] Foreign Application Priority Data

Feb. 29, 1996 [JP] Japan ................................. 8-042637

[51] Int. Cl.[6] ....................................................... H02J 7/00
[52] U.S. Cl. ................................................................ 320/107
[58] Field of Search .................................. 320/107, 112, 320/110, 150, 113, 115, 90, 96

[56] References Cited

U.S. PATENT DOCUMENTS 4,206,435 6/1980 Harris et al. ............................ 336/65
4,873,479 10/1989 Iimura et al. ........................... 320/110
5,483,405 1/1996 Kaelin ...................................... 336/96

Primary Examiner—Peter S. Wong
Assistant Examiner—Lawrence Luk
Attorney, Agent, or Firm—Wenderoth, Lind & Ponack, L.L.P.

[57] ABSTRACT

The battery charger of the present invention is provided with a printed circuit board in a case. A transformer, the primary side components, the secondary side components are fixed in the printed circuit board. The transformer insulates the surface by the insulating case. In the printed circuit board, using the transformer as border, the primary side components are set on one side and the secondary side components are set on the other side. The transformer isolates the primary side components and the secondary side components.

15 Claims, 4 Drawing Sheets

BATTERY CHARGER

BACKGROUND OF THE INVENTION

The present invention relates to a battery charger for a rechargeable battery.

The FIG. 1 shows the block diagram of the battery charger. The battery charger shown in this Fig. is provided with the transformer 1 to change the voltage of the commercial power supply to a voltage suitable for charging the rechargeable battery 4. The transformer connects the primary side components 2 and the secondary side components 3 then the secondary side components 3 is connected to the rechargeable battery 4. At present, the most commonly used battery charger is provided with a switching power supply. The switching power supply changes the input commercial power voltage to a direct current, and inputs this direct current to the primary side of the transformer 1 by switching at a frequency value of, for example, a few tens of KHz. Because the switching power supply changes to a high frequency value, it enables a light weight and small dimension transformer compared to a commercial power supply transformer. The alternating current with its voltage regulated by the transformer 1, is changed into a direct current by the secondary side and supplied to the rechargeable battery 4.

The battery charger shown in FIG. 1, needs an insulation between the primary side and the secondary side of the transformer. Because the primary side uses the commercial power voltage, the voltage gets higher than the secondary side. Because the secondary side is at the voltage suitable for the charging of the rechargeable battery 4, it is a low voltage. To be able to isolate the primary side and the secondary side of the transformer, the primary side components 2 and the secondary side components 3 are fixed on the printed circuit board separated by for example more than 7 or 8 mm. This structure makes the production of a compact battery charger difficult because the printed circuit board is made larger.

It is possible to insulate the primary side and the secondary side by fixing an insulating plate between the primary side components 2 and the secondary side components 3. But it takes time to fix the insulating plate exactly at the right position of the printed circuit board. Especially because the insulating plate, like electronic components, cannot be fixed by soldering on the printed circuit board. For this reason, it is necessary to use a particular structure to fix it mechanically on the printed circuit board, like the primary side components and the secondary side components, it is not possible to fix it efficiently on the printed circuit board. Therefore the structure adding an insulating plate rises the cost of components and as bad effect lowers the production efficiency.

The present invention has been developed to solve the problems of that kind of weak point. The most important purpose of the present invention is to isolate the primary side components and the secondary side components in an ideal condition, and to anable the production of a charge designed compact as a whole.

Furthermore, the other important purpose of the present invention, is to produce a battery charger that can insulate without fail and fix the transformer without needing to fix a component insulating the primary side components from the secondary side components especially on the printed circuit board.

The above and further objects and features of the invention will more fully be apparent from the following description with accompanying drawings.

SUMMARY OF THE INVENTION

The battery charger of the present invention is provided the printed circuit board in a case. The transformer that changes the input voltage into a voltage suitable for charging the rechargeable battery, the primary side components that forms the primary side circuit of that transformer and the secondary side components that forms the secondary side circuit of the transformer are fixed in the printed circuit board.

Furthermore, the battery charger of the present invention, is mounted on the printed circuit board, with the primary side components on one side and the secondary side components on the other side of the transformer used as a separation. The transformer placed at the border of the primary side components and of the secondary side components, isolates the surface by an insulating case. The transformer covered by the insulating case isolates the primary side components and the secondary side components.

The battery charger of this structure isolates in ideal condition the primary side components and the secondary side components and anables a compact design as a whole. This is because this battery charger uses a transformer which surface is insulated by an insulating case as insulating material between the primary side components and the second secondary side components. The transformer is conveniently electrically connected at the border of the primary side components and the secondary side components. For this reason, it is set at the ideal position to isolate the primary side components and the secondary side components. Then compared to the other parts, because the transformer is fairly larger, it insulates the primary side components and the secondary side components without fail. And, because the transformer is fixed on the printed circuit board, due to the structure fixing the insulating case to this transformer, the primary side components and secondary side insulating material to be specially fixed, can be omitted. This way by using the transformer jointly as insulating material, it is not necessary to make a gap between the primary side components and the secondary side components and it becomes possible to design a compact battery charger as a whole.

Furthermore, the battery charger of the present invention makes possible to use also the insulating case of the transformer as support of the contact point connected to the rechargeable battery charging terminal. This battery charger connects the contact point to the insulation case. The contact point protrudes outside the case and connects the charging terminal of the rechargeable battery.

The battery charger with this construction uses the insulating case of the transformer also as a holder for the contact point. With this construction it is not necessary to use an exclusive component to keep the contact point at the right place, then the number of components is reduced and the manufacturing cost is lowered. Further, because the insulating case of the transformer is fairly large, and because the contact point protrudes outside the case, the insulating case of the transformer can be set the ideal place.

DETAILED DESCRIPTION OF THE INVENTION

Figure 1:
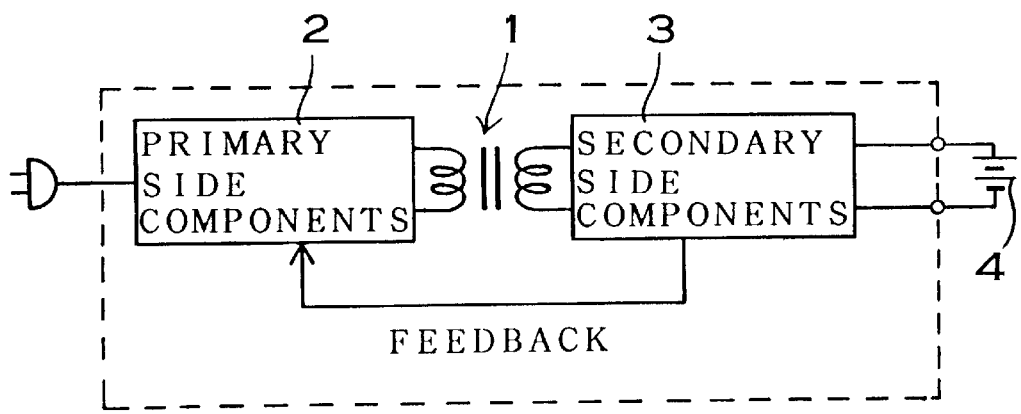
FIG. 1 is a block diagram of a prior art battery charger.
Figure 2:
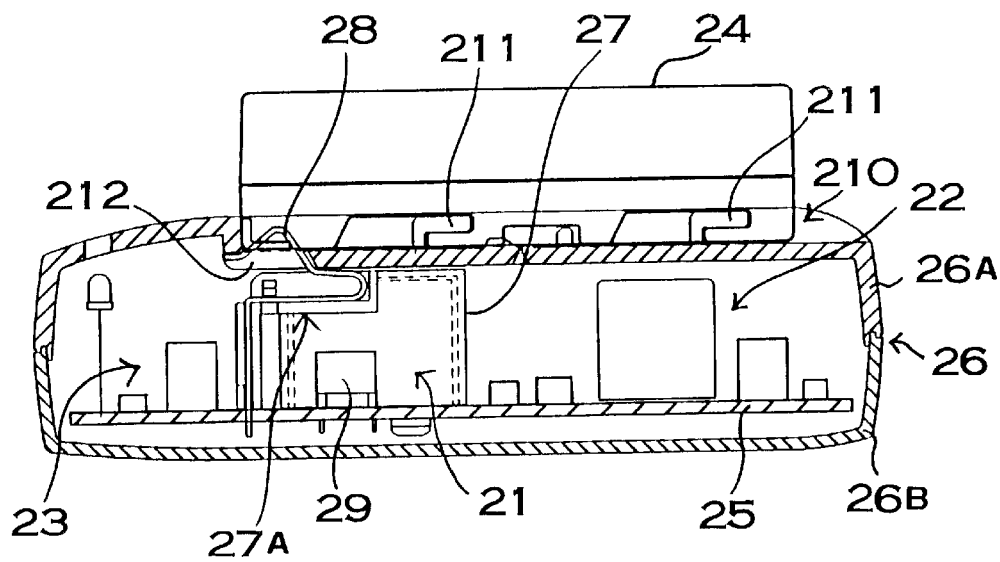
FIG. 2 is a cross sectional view of the transformer embodiment of the present invention.
Figure 3:
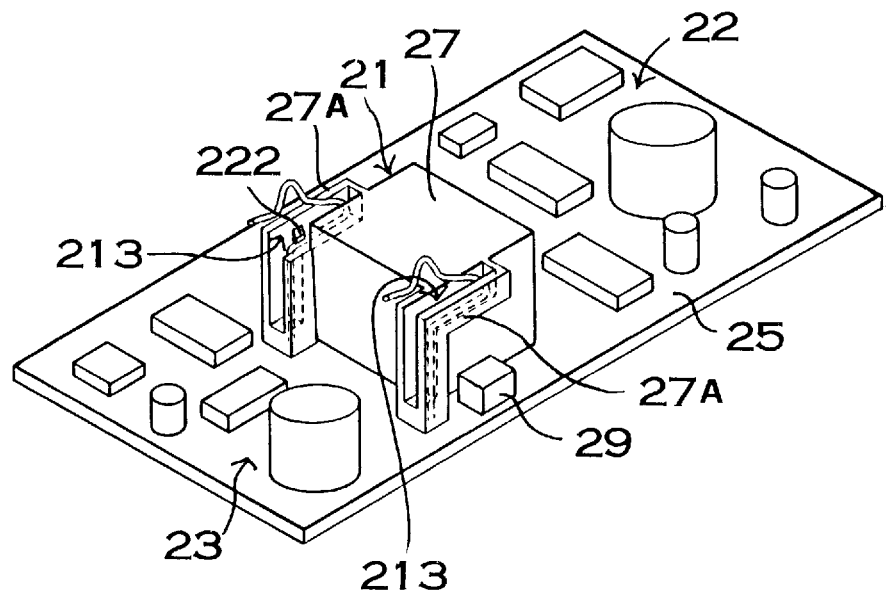
FIG. 3 is a perspective view of the printed circuit board provided in the battery charger of the FIG. 2.

The FIG. 2 shows the cross sectional view of the battery charger and the FIG. 3 shows the printed circuit board 25 provided in this battery charger. In the battery charger shown in FIG. 2, the printed circuit board 25 is mounted and fixed in the case 26. The case 26 is a molded plastic component made of the upper case 26A and the lower case 26B. The upper and lower cases 26A and 26B are fixed together by their circumference. The attachment section 210 is set on the upper side of the upper case 26A and allows free setting in and out of the rechargeable battery 24. The attachment section 210 is molded together with the hook 211 that protrudes to fix the rechargeable battery 24 at the right place. The hook 221 is caught to the hollow part of the rechargeable battery 24 setting at the right place the rechargeable battery 24.

The rechargeable battery 24 set at the attachment section 210, is charged by connecting electrically the charging terminal to the contact point 28. To be able to connect the contact point 28 to the charging terminal, the case 26 opens the slit 212 that protrudes the contact point 28 outside the case 26. The contact point 28 made of elastic and shapable material, protrudes from the slit 212 outside the case 26, and is in contact with the charging terminal. The contact point 28 is connected to the charging circuit fixed into the printed circuit board, and charges the rechargeable battery 24.

The switching power supply that is the charging circuit is fixed into the printed circuit board 25. The switching power supply is made of the transformer 21, the primary side components 22 and the secondary side components 23. The transformer 21 changes the input voltage into a voltage suitable for the charging of the rechargeable battery 24. The primary side components 22 are a circuit connected to the primary side of this transformer 21 and the secondary side components are a circuit connected to the secondary side of the transformer 21. The primary side components 22 change the input alternating current in direct current, switch the direct current and form the circuit supplying the primary side of the transformer 21. The secondary side components 23 transform the alternating current output at the secondary side of the transformer 21 into direct current and supply the rechargeable battery 24.

The printed circuit board 25 shown in FIG. 2 and FIG. 3 fixes with the transformer 21 as a border, the primary side components 22 on its right side and the secondary side components 23 on its left side. The transformer 21, the primary side components 22 and the secondary side components 23 are fixed by soldering to the printed circuit board 25. The transformer 21 is fixed slightly on the left of the center line of the printed circuit board 25.

The transformer 27 insulates its surface by the insulating case 27 and as a border insulates the primary side components 22 and the secondary side components 23. The insulating case 27 is a plastic case designed to hold the transformer 21. The transformer 21 is placed into the plastic insulating case 27 insulating its surface. The insulating case 27 is designed as a box with the opening at the bottom. The transformer 21 is placed into the insulating case 27 through the opening at the bottom and the lead wires of the transformer 21 project from the bottom. The lead wires projecting out from the bottom of the insulation case 27, are fixed by soldering in the printed circuit board 25. In the state when the insulating case 27 is fixed to the printed circuit board 25, the opening of the bottom is closed by the printed circuit board 25.

The insulation case 27 is connected to the transformer 21 or strongly inserted and fixed. The suitable filling material is poured into the gap between the transformer 21 and the insulating case 27 (not shown in the figure). The heat of the transformer 21 is efficiently transmitted to the insulating case 27 by the filling material. This construction offers the particularity to protect efficiently the transformer 21 from heat. Furthermore, adding to the fact of blocking the gap, the filling material can fix strongly the transformer 21 and the insulating case 27.

As shown in FIG. 2 and in FIG. 3, the insulating case 27 is built in one piece with the contact holder 27A that holds the contact point 28 at the fixed place. The contact points 28 are placed on both sides of the insulating case 27. Therefore, the contact holder 27A is built in one piece at each side of the insulating case 27 protruding out the slit 212 of the case 26, the contact holder 27A is built vertically from the top of the insulating case 27. To be able to fix the "L" shaped contact point 28, the contact holder 27A is the "L" shaped insertion groove 213.

The contact point 28 is placed in the insertion groove 213 that is the contact holder 27A, and to prevent its protruding is built in one piece with the projection 222. The projection 222 projects out the inner side of one side of the horizontal part of the insertion groove 213 and is built in one piece with it. The upper side of the projection 222 is sloping to place smoothly the contact point 28 into the insertion groove 213. The lower face of the projection 222 is made horizontal to prevent protruding of the contact point 28 placed in the insertion groove 213.

The contact point 28 of global "L" shape, has its tip folded, the tip of this folded part is then bent, the angle pointing up, making, from the slit 212, an elastic projection in the outer part of the case 26. The lower end of the contact point 28 is fixed by soldering into the printed circuit board 25, then placed in the contact holder 27A and fixed at the right place. There is a space at the bottom of the insulating case 27 that has the contact holder 27A that projects from the side. The feedback components 29 of the photo-coupler or of the coupler-condenser are set at the place of this space in the printed circuit board 25. That is to say that the space that is formed in the side of the insulating case 27 of the transformer 21, is efficiently used, holding the feedback components 29. At the this place, because the feedback components 29 send the signal from the secondary side components 23 to the primary side componets, this is also an electrically ideal place.

Figure 4:
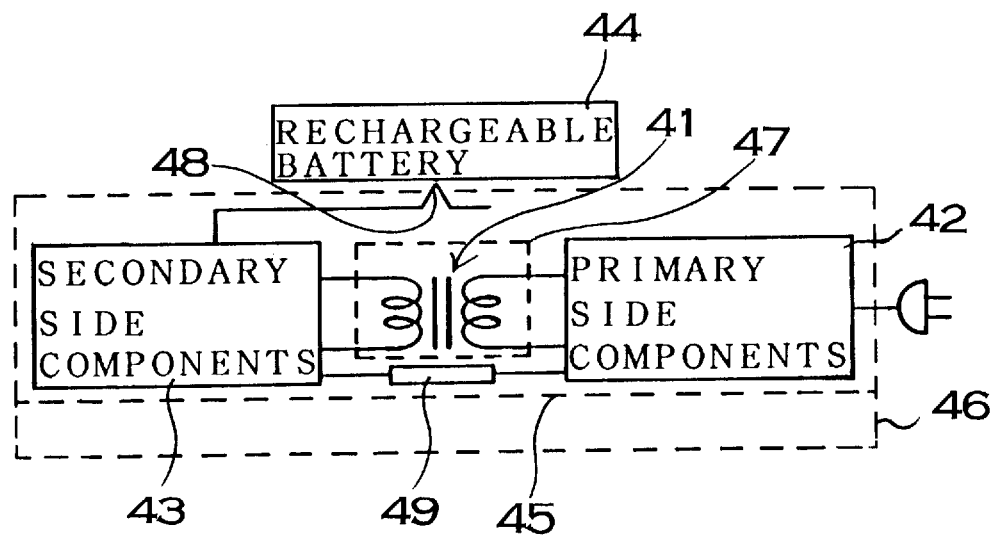
FIG. 4 is a block diagram of one example of the charging circuit.
Figure 5:
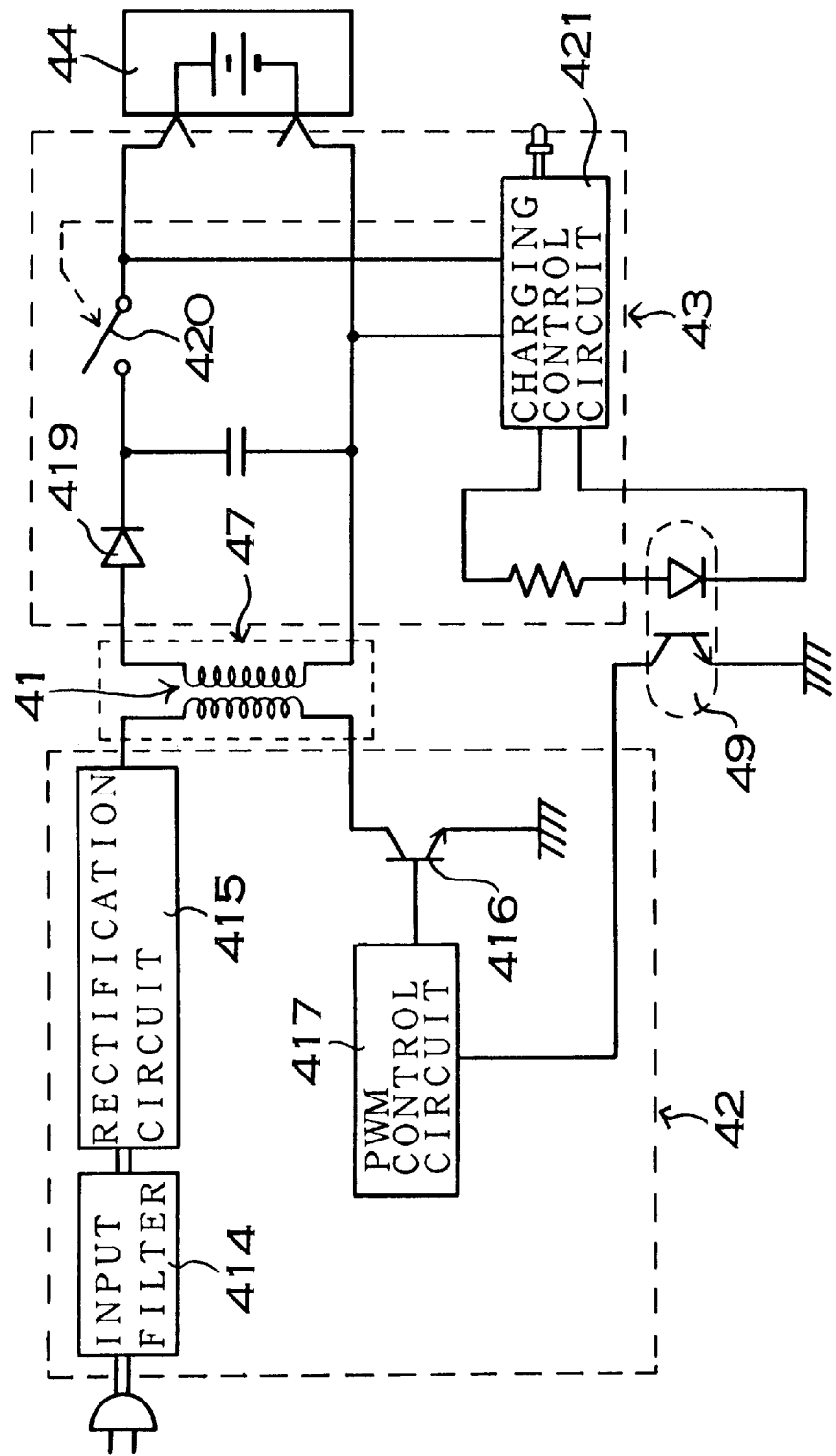
FIG. 5 is a circuit diagram of the charging circuit shown in FIG. 4.

The FIG. 4 shows the block diagram of the battery charger and the FIG. 5 the circuit diagram. The battery charger shown in FIG. 4 and in FIG. 5 is provided with a switching power supply. The switching power supply is provided with the primary side components 42 connected to the primary side of the transformer 41 and of the secondary side components 43 connected to the secondary side.

The primary side components 42 are provided with the input filter 414 that takes off the noise that is included in the commercial power supply, of the rectification circuit 415 that changes the alternating input supply into direct current, of the transistor 416 that is the switching device changing the direct current of the rectification circuit 415 into a high frequency direct current, and of the PWM control circuit 417 that periodically switches the transistor 416 ON-OFF.

The rectification circuit 415 is provided with the diode that rectifies the alternating current, and with the electrolysis capacitor smoothing the rectified pulse through this diode. The PWM control circuit 417, during the time needed to make the transistor ON, changes the duty and adjusts the charging current and the output voltage of the secondary side of the transformer 41. When the ON period of the transistor 416 gets longer, the output voltage of the secondary side of the transistor 41, rises and the charging current of the rechargeable battery 44 gets larger. The PWM control circuit 417 controls the duty of making ON the transistor 416 by the signal input from the photo-coupler that is the feedback components 49. The PWM control circuit 417 controls ON-OFF the transistor 416 by, for example, a frequency of a few kHz to a frequency of a few hundred kHz.

The secondary side components 43 are provided with the diode 419 that rectifies the alternating current that is the output of the secondary side of the transformer 41, with the smoothing capacitor that smooths the pulse rectified by the diode 419, with the charging switch 420 that is the switching device making the charging current of the rechargeable battery 44 ON-OFF, and with the charging control circuit 421 that controls the charging switch 420 ON-OFF.

The charging control circuit 421 controls the charging switch 420 in ON state until the rechargeable battery 44 is fully charged, and when the rechargeable battery 44 is fully charged, controls the charging switch in OFF state. Furthermore, the charging control circuit 421 detects the charging current and the charging voltage of the rechargeable battery 44 and sends the detected signal to the PWM control circuit 417 through the photo-coupler that is the feedback components, then controls the PWM control circuit 417 and controls the charging state of the rechargeable battery 44.

The charging control circuit 421 and the PWM control circuit 417 control the charging current and the charging voltage of the rechargeable battery 44, and charge fully the rechargeable battery 44 of various types in the optimum state. The charging current and the charging voltage that are designed to be optimum for the rechargeable battery 44 to be charged. For example, if the rechargeable battery 44 is a nickel-cadmium battery or a nickel-hydrogen battery, the rechargeable battery 44 is fully charged by a constant charging current, and if the rechargeable battery 44 is a lithium ion rechargeable battery, it is charged at first by a constant current, and when the battery voltage reaches the designed voltage, it charges at constant voltage.

The charging control circuit 421 detection signal is sent to the PWM control circuit 417 through the photo-coupler. The photo-coupler is the feedback components 49 that feeds the signal back from the secondary side components 43 to the primary side components 42. The battery charger that uses a photo-coupler in the feedback components 49, can completely isolate the primary side components 42 and the secondary side components 43. This is because as shown in FIG. 5, not connecting the earth line, it can feed back from the secondary side to the primary side. But, instead of a photo-coupler, a capacitor can be used in the feedback components. Because the charging circuit shown in FIG. 4 and in FIG. 5 can control the charging of the rechargeable battery 44 by the charging control 421 and the PWM control circuit 417, the charging switch 420 is not forcibly necessary. This is because, controlling the PWM control circuit 417 by the charging control circuit 421, it is possible to control the secondary side output of the transformer 41 in a state where it does not charge the rechargeable battery 44.

Furthermore, because the charging circuit shown in FIG. 4 and in FIG. 5 does not use the feedback component 49 of the photo-coupler etc., it is also possible to control the charge of the rechargeable battery 44. By the PWM control circuit 417, this charging circuit makes the switching device ON-OFF by a fixed duty, and makes the transformer 41 secondary side output uniform.

Figure 6:
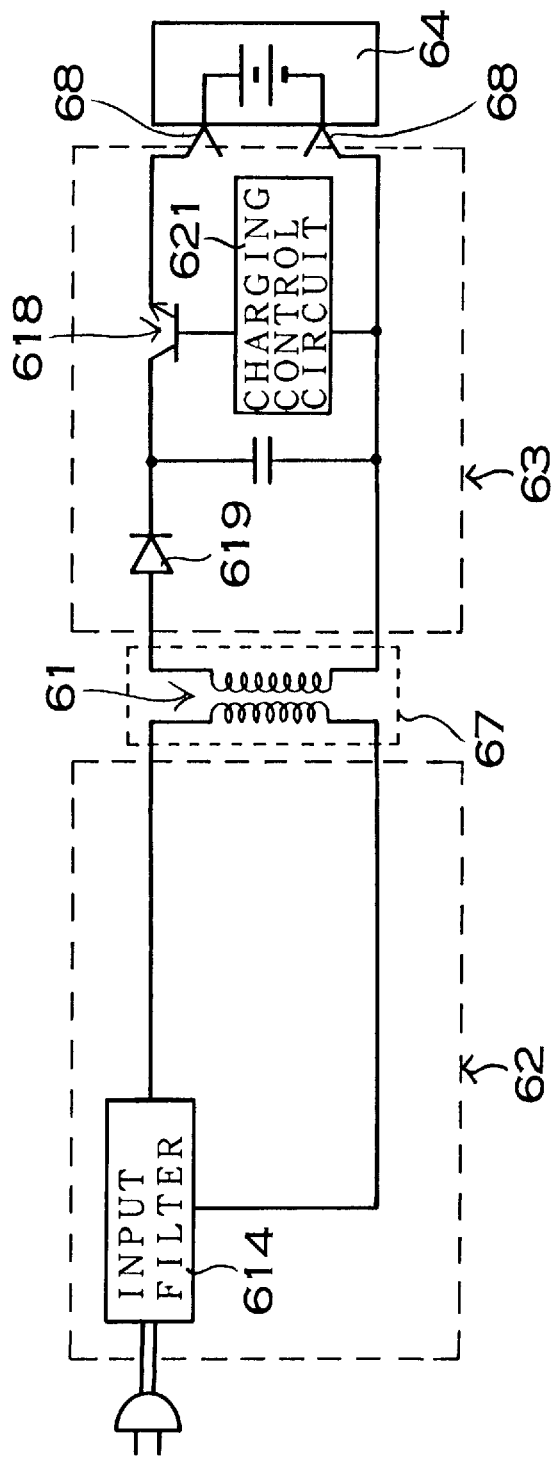
FIG. 6 is an another charging circuit diagram housed in the battery charger of the present invention.

The battery charger of the present invention does not specify the charging circuit in the switching power supply shown in FIG. 4 and in FIG. 5. As shown in FIG. 6, inputting the commercial power supply directly to the transformer 61, it is also possible to control the charging state of the rechargeable battery 64 by the secondary side of the transformer 61. This output control circuit can reduce the number of primary side components 62, but the transformer 61 will get bigger. This is because the transformer 61 changes the voltage of the alternating current of low frequency value. This charging circuit, is provided with the diode 619 that rectifies the alternating current that is the secondary side output of the transformer 61, to the secondary side part 63, with the smoothing capacitor that smooths the pulse rectified by the diode 619, with the switching device 618 to control the charging stage of the rechargeable battery 64 and with charging control circuit 621 that control this switching device 618.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A battery charger for charging a rechargeable battery, comprising:

a case;

a printed circuit board provided in said case;

a transformer for converting an input voltage into a voltage for charging the rechargeable battery, said transformer being fixed to said printed circuit board;

an insulating case covering said transformer;

at least one primary side component fixed to said printed circuit board and constituting a primary side power supply circuit;

at least one secondary side component fixed to said printed circuit board and constituting a secondary side power supply circuit;

contact holders located on said insulating case; and contact points supported in said contact holders and being exposed outside said case, said contact points being operable to electrically connect to the rechargeable battery;

wherein said at least one primary side component and said at least one secondary side component are fixed on opposite sides of said transformer with said transformer serving as a border between said at least one primary side component and said at least one secondary side component such that said transformer and said insulating case together isolate said at least one primary side component from said at least one secondary side component.

2. The battery charger of claim 1, wherein said insulating case is plastic and is sized to hold said transformer.

3. The battery charger of claim 2, wherein said insulating case is a box having an opening located at a bottom of said box.

4. The battery charger of claim 3, wherein said opening is closed by said printed circuit board.

5. The battery charger of claim 1, wherein said insulating case is fixed in close contact to said transformer.

6. The battery charger of claim 1, wherein said insulating case is force-fitted to said transformer.

7. The battery charger of claim 1, wherein a filling material is located in a gap between said insulating case and said transformer.

8. The battery charger of claim 1, wherein said contact holders are integrally formed as one piece with said insulating case.

9. The battery charger of claim 1, wherein said contact holders are located on opposite sides of said insulating case.

10. The battery charger of claim 1, wherein said contact holders have formed therein L-shaped insertion grooves; and said contact points are L-shaped and are fixed in said contact holders.

11. The battery charger of claim 10, wherein said contact holders each comprise a protrusion located in said insertion groove to prevent projection of said contact points.

12. The battery charger of claim 11, wherein said protrusions each comprise an upper side which is sloping and a lower side which is horizontal.

13. The battery charger of claim 1, wherein said contact points are fixed to said printed circuit board.

14. The battery charger of claim 1, further comprising a feedback component connected to said primary side power supply circuit and to said secondary side power supply circuit, said feedback component further being fixed to said printed circuit board under one of said contact holders.

15. The battery charger of claim 14, wherein said feedback component is a photocoupler.

* * * * *